United States Patent

Sato

Patent Number: 5,723,174
Date of Patent: Mar. 3, 1998

[54] METHOD OF FORMING MOLD RELEASE FILM

[75] Inventor: Yasuhiko Sato, Omiya, Japan

[73] Assignee: Fuji Photo Optical Co., Ltd., Omiya, Japan

[21] Appl. No.: 798,060

[22] Filed: Feb. 11, 1997

[30] Foreign Application Priority Data

May 14, 1996 [JP] Japan ............................ 8-145163

[51] Int. Cl.$^6$ ........................................ B05D 3/12
[52] U.S. Cl. ................... 427/133; 427/230; 427/367; 204/192.15
[58] Field of Search ..................... 427/133, 230, 427/367; 204/192.15

[56] References Cited

U.S. PATENT DOCUMENTS 5,569,474  10/1996  Kitaichi et al. .................... 425/547

FOREIGN PATENT DOCUMENTS 3-137032   6/1991   Japan.
3-242334  10/1991   Japan.

*Primary Examiner*—Janyce Bell
*Attorney, Agent, or Firm*—Ronald R. Snider

[57] ABSTRACT

In a method of forming a mold release film on at least molding surfaces of a mold comprising an upper die, a lower die, and a cylindrical die for press molding of an optical element, a TiAlN film is formed on the molding surfaces of the mold and is polished so as to yield a center-line mean roughness of about 1 nm or less, thereby improving the mold in terms of durability, heat resistance, specular characteristic, and the like while improving releasability of the mold and a molded article with respect to each other. A TiAlN film (1) is formed on molding surfaces (31a, 32a) of upper and lower dies (31, 32) by a sputtering technique or the like. Thus formed TiAlN film (1) is polished till its center-line mean roughness becomes about 1 nm. Accordingly, the molding surfaces (31a, 32a) are prevented from being discolored or becoming rough due to heat, whereby the mold can be improved in terms of durability, heat resistance, and the like.

2 Claims, 2 Drawing Sheets

METHOD OF FORMING MOLD RELEASE FILM

RELATED APPLICATIONS

This application claims the priority of Japanese Patent Application No. 8-145163 filed on May 14, 1996, which is incorporated herein by reference.

BACKGROUND OF THE INVENTION

1. Field of the Invention

The present invention relates to a method of forming a mold release film and, more specifically, to a method of forming a mold release film on a mold which comprises an upper die, a lower die, and a cylindrical die and is used for press molding of an optical element such as lens.

2. Description of the Prior Art

Recently, as optical instruments have a higher performance and lighter weight, optical elements having a higher precision have been required. Accordingly, aspherical lenses and the like have been formed by press molding. Performed in this press molding is reheat press technique in which a mold comprising an upper die, a lower die, and a cylindrical die is used and, while heat is applied to the mold in a non-oxidizing atmosphere such as nitrogen gas, a glass blank, which is a material for a lens, is filled between the upper and lower dies so that a lens shape formed in the molding surfaces of the upper and lower dies is transferred to the glass blank, thereby forming the lens, which is a molded article.

It has been required for the mold used in the press molding of such a glass blank to be excellent in the releasability of the molded article and the mold with respect to each other, durability, heat resistance, oxidation resistance, specular characteristic, and the like. In order to satisfy these requirements, methods of forming various kinds of mold release films on molds have been proposed.

For example, Japanese Patent Publication No. 7-45331 discloses a method of forming a mold release film made of a metal nitride such as TiN, TaN, or AlN, which is excellent in durability and specular characteristic, is formed on the molding surface of the mold. Also, Japanese Patent Publication No. 7-35261 discloses a method of forming a film made of a nitride such as TiAlN on the side faces and rear faces of the upper and lower dies and the whole surface of the cylindrical die in the mold. According to this method, the durability of the mold can be improved, while the sliding characteristics of the upper and lower dies and the cylindrical die with respect to each other can be enhanced.

The nitride such as TiN disclosed in the above-mentioned Japanese Patent Publication No. 7-45331, however, may have a larger number of pinholes depending on the method of its formation and, in the atmosphere at a temperature higher than 400° C., may be discolored and have a rough surface. Accordingly, in an atmosphere at a temperature of 500° to 600° C., which is the molding temperature of the glass blank, the specular characteristic may not be maintained. Consequently, the roughness on the molding surface may be transferred to a molded article, thereby forming a rough surface thereon and yielding a fog or the like in a lens which is the molded article.

The TiAlN film disclosed in the above-mentioned Japanese Patent Publication No. 7-35261 is excellent in oxidation resistance, durability, and the like since it has less pinholes and a relatively high oxidation resistance temperature of 600° C. Since the surface roughness of the TiAlN film formed on the mold is relatively high, however, it may be problematic in terms of specular characteristic. Accordingly, when a glass blank is molded by molding surfaces having a TiAlN film thereon, a fog may be formed in the molded article. Therefore, such a film may not favorably be used as a mold release film.

SUMMARY OF THE INVENTION

In view of these circumstances, it is an object of the present invention to provide a method of forming a mold release film which is excellent in specular characteristic as well as durability, oxidation resistance, heat resistance, and the like, and can improve the releasability of the mold and the glass blank with respect to each other.

The method in accordance with the present invention is a method of forming a mold release film on a mold comprising an upper die, a lower die, and a cylindrical die used for press molding of an optical element, and comprises the steps of:

forming a TiAlN film on at least molding surfaces of the upper and lower dies; and polishing the TiAlN film so as to yield a center-line mean roughness (Ra) of about 1 nm or less.

Preferably, the TiAlN film is also formed on the side faces of the upper and lower dies and the whole surface of the cylindrical die.

DETAILED DESCRIPTION OF THE PREFERRED EMBODIMENTS

Figure 1:
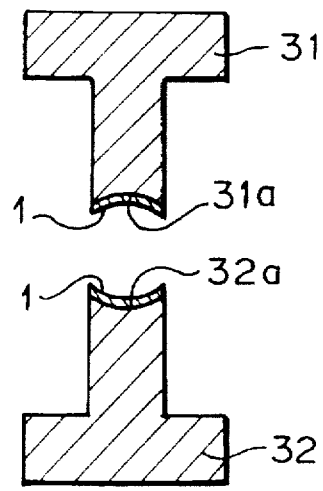
FIG. 1 is a schematic view showing upper and lower dies on which a TiAlN film is formed by the method of forming a mold release film in accordance with the present invention.

In the following, an embodiment of the present invention will be explained with reference to the drawings. FIG. 1 is a cross-sectional view showing upper and lower dies of a mold on which a mold release film is formed in accordance with this embodiment. An upper die 31 and a lower die 32 of the mold, as with a cylindrical die which will be explained later, are made of a hard metal such as tungsten carbide (WC), and their molding surfaces 31a and 32a have such surface forms that a lens having a desired shape can be formed thereby. A TiAlN film 1 is formed on the molding surfaces 31a and 32a of the upper and lower dies 31 and 32. This TiAlN film has a thickness of about 2 μm.

Figure 2:
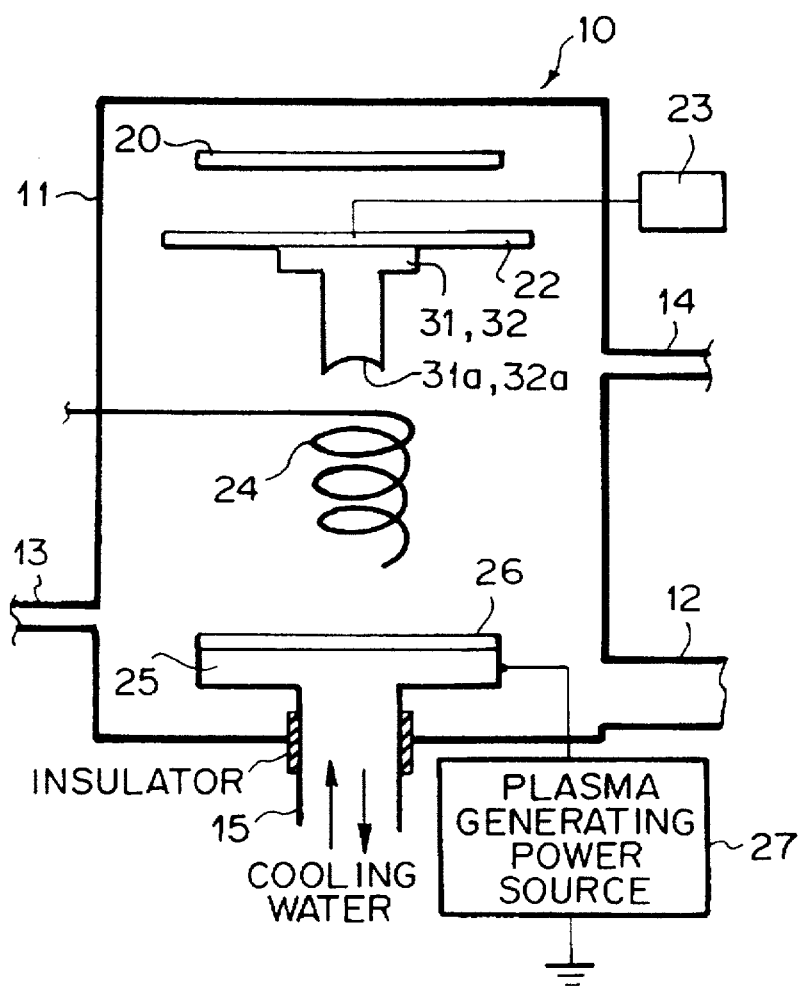
FIG. 2 is a schematic view showing the configuration of a sputtering apparatus for forming a TiAlN film on the molding surfaces of upper and lower dies.

FIG. 2 is a schematic view showing the configuration of a sputtering apparatus 10 for forming the TiAlN film 1 on the molding surfaces 31a and 32a of the upper and lower dies 31 and 32 by a sputtering technique. As shown in FIG. 2, the sputtering apparatus 10 comprises a vacuum vessel 11, an exhaust outlet 12 formed in the vacuum vessel 11, and a gas inlet 13 for introducing argon gas into the vacuum vessel 11, and a gas inlet 14 for introducing at least one of nitrogen gas and ammonia gas into the vacuum vessel 11. The exhaust outlet 12 is connected to a non-depicted vacuum source, whereas the gas inlets 13 and 14 are connected to non-depicted gas sources. Disposed in the upper portion of the vacuum vessel 11 is a heater 20. Disposed below the heater 20 is a holder 22 for holding the upper die 31 and the lower die 32. The upper die 31 and the lower die 32 are held by the holder 22 such that their molding surfaces 31a and 32a are directed downward. Connected to the holder 22 is a bias power source 23 for applying a bias voltage to the upper die 31 and the lower die 32. Disposed below the holder 22 is a coil 24 for generating glow discharge. Disposed in the lower portion of the vacuum chamber 11 is a cathode electrode 25 which is insulated from the earth, whereas a TiAl target is mounted on the cathode electrode 25. Here, the ratio of Ti/Al in the TiAl target is about 1:1. Cooling water is supplied to the cathode electrode 25 from a cooling water inlet 15, whereas the cathode electrode 25 is connected to a plasma generating power source 27.

In the following, a method of forming the TiAlN film 1 on the molding surfaces 31a and 32a by means of the sputtering apparatus 10 shown in FIG. 2 will be explained. Here, in this embodiment, since the same TiAlN film 1 is formed on each of the upper die 31 and lower die 32, only the formation of the TiAlN film 1 on the upper die 31 will be explained, without the detailed description being repeated in regard to the formation of the TiAlN film 1 on the lower die 32.

First, the upper die 31 whose molding surface 31a has been precisely mirror-polished in conformity with a desired lens shape is cleansed with an organic solvent and then is held by the holder 20. Subsequently, the vacuum vessel 11 is exhausted through the exhaust outlet 12 such that the pressure therein is reduced to about $10^{-4}$ to $10^{-5}$ Torr, and then argon gas (Ar) is introduced from the gas inlet 13. Thereafter, a high-frequency voltage is applied to the coil 24 so as to generate glow discharge. Further, a negative voltage is applied to the upper die 31 from the bias power source 23, whereby sputtering cleaning of the molding surface 31a of the upper die 31 is effected with argon ions. Subsequently, a high-frequency voltage or AC voltage is applied to the cathode electrode 25 so as to generate glow discharge near the TiAl target 26, thereby imparting a bombardment of argon ions onto the TiAl target 26. Simultaneously therewith, at least one of nitrogen gas and ammonia gas is introduced from the gas inlet 14, and a high-frequency voltage is applied to the coil 24 so as to form a nitrogen plasma. Further, a negative bias voltage is applied to the upper die 31 from the bias power source 23, so as to draw the nitrogen ions in the nitrogen plasma toward the upper die 31. Accordingly, reactive sputtering of TiAl can be effected, allowing the TiAlN film 1 to be formed on the molding surface 31a of the upper die 31.

Thus formed TiAlN film 1 in this state has a center-line mean roughness (Ra) of about 10 nm and is hard to form a molding surface which is excellent in specular characteristic. Accordingly, after the TiAlN film 1 is generated by the sputtering apparatus 10, it is polished till its center-line mean roughness becomes about 1 nm. The roughness of the TiAlN film 1 is caused by the film roughness generated at the early stage of film formation. Accordingly, once the polishing processing such as that noted above is effected, there is little possibility that the film will become rough when the TiAlN film 1 is superposed thereon in future.

Thus, the final TiAlN film 1 is formed, whereby the molding surface 31a of the upper die 31 excellent in specular characteristic can be obtained. In a similar manner, the polished TiAlN film 1 is formed on the molding surface 32a of the lower die 32.

Accordingly, the upper die 31 and lower die 32, which will not form fogs or the like in the molded article caused by the roughness transferred from the molding surfaces 31a and 32a, can be obtained.

Here, the above-mentioned polishing processing is effected by means of an abrasive containing diamond grains with a diameter not greater than 0.1 μm. In order to prevent the shape of the molding surfaces 31a and 32a from being damaged, while the mold is rotated, a polishing jig is moved so as to uniformly polish the whole surface thereof. The center region of the surface, which is hard to polish in particular, is finished as the polishing jig traverses therethrough.

Since the TiAlN film 1 contains Al, aluminum oxide ($Al_2O_3$) is generated on the surface of the TiAlN film 1 when Al is oxidized. Aluminum oxide has a high hardness and is highly resistant to heat. Also, once aluminum oxide is formed, it can improve the durability, heat resistance, and oxidation resistance of the upper die 31 and lower die 32 since they are prevented from being further oxidized inside.

Thereafter, the upper die 31 and lower die 32 having the molding surfaces with thus formed TiAlN film 1 are used to form a desired lens from a glass blank by press molding.

Figure 3:
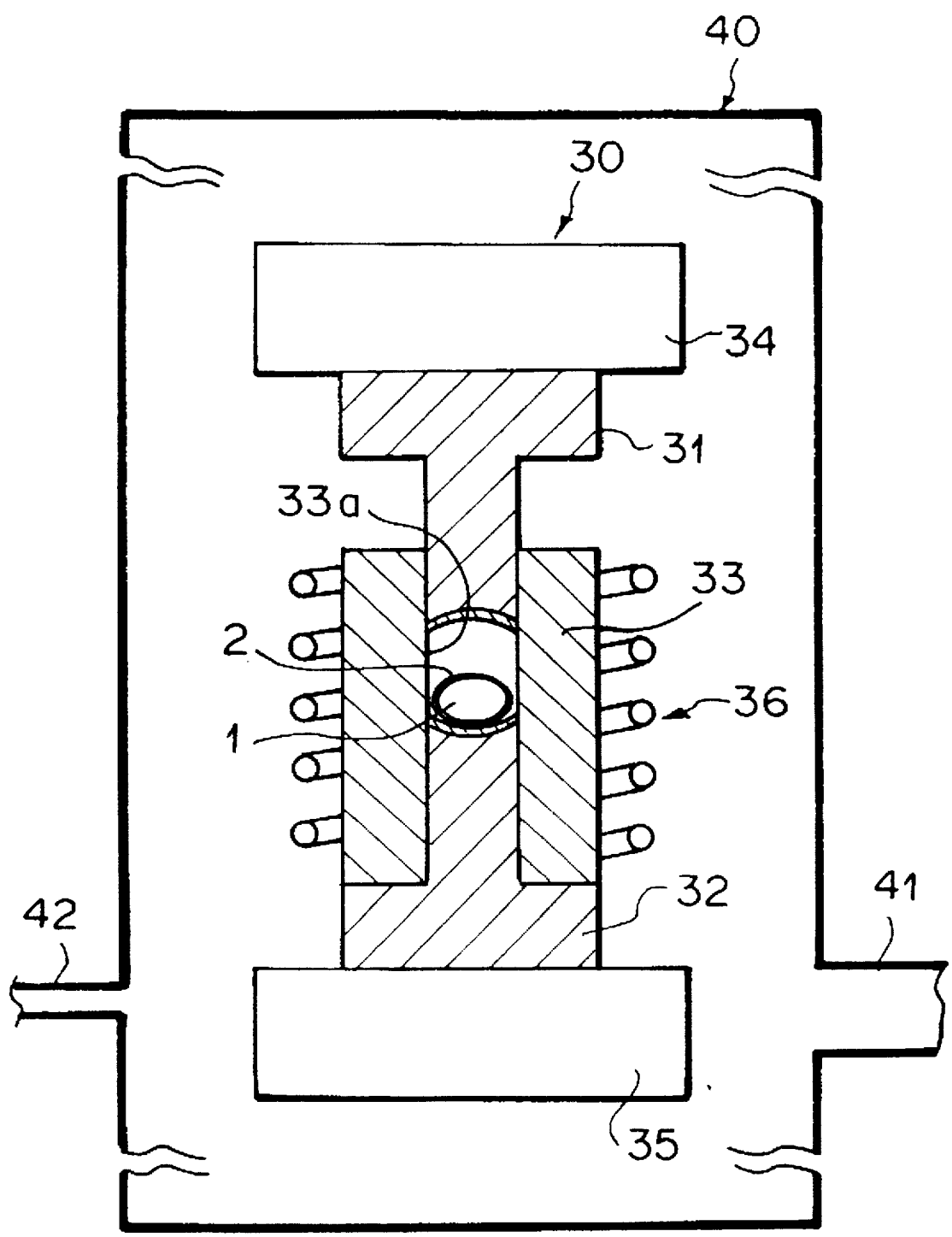
FIG. 3 is a view showing the configuration of a press-molding machine for molding a glass blank.

FIG. 3 is a cross-sectional view showing a schematic configuration of a press-molding machine 30 adopting the upper die 31 and lower die 32 whose molding surfaces 31a and 32a have the TiAlN film 1. As shown in FIG. 3, the press-molding machine 30 comprises the upper die 31 and lower die 32 having the molding surfaces 31a and 32a on which the TiAlN film 1 has been formed as mentioned above, and a cylindrical die 33 having a die hole 33a whose inner circumference has been precisely mirror-polished. The upper die 31 is fixed to a driving table 34 and is driven by a non-depicted driving unit so as to be inserted into the die hole 33a of the cylindrical die 33 and slide up and down on the inner circumference thereof. On the other hand, the lower die 32 is fixed to a support table 35 so as not to slide against the cylindrical die 33.

An induction heating coil 36 is wound around the cylindrical die 33. As an electric power is supplied to this induction heating coil 36, the cylindrical die 33 is heated to a temperature (500° to 600° C.) which is necessary for molding a glass blank 2. Preferably, a temperature measuring means such as thermocouple is attached to the cylindrical die 33 so as to measure the temperature of the cylindrical die 33, allowing a desired temperature to be maintained.

The press-molding machine 30 is disposed within a vacuum vessel 40. Formed in the vacuum vessel 40 are an exhaust outlet 41 and a gas inlet 42 for introducing nitrogen gas into the vacuum vessel 40. The exhaust outlet 41 is connected to a non-depicted vacuum source, whereas the gas inlet 42 is connected to a gas source for introducing nitrogen gas into the vacuum vessel 40. Accordingly, nitrogen gas is introduced from the gas inlet 42, whereby the glass blank 2 is molded in a nitrogen atmosphere. Here, in order to improve the releasability of the upper die 31 and lower die 32 and the glass blank 2 from each other, a carbon film 3 having a thickness of less than 50 angstroms or, preferably, less than 10 angstroms is formed on the glass blank 2.

In the following, a method of forming the glass blank 2 by means of the press-molding machine 30 shown in FIG. 3 will be explained.

First, the glass blank 2 is inserted into the die hole 33a of the cylindrical die 33 such that the faces having the carbon film 3 will come into contact with the molding surfaces 31a and 32a of the upper die 31 and lower die 32 at the time of molding. Subsequently, an electric power is supplied to the induction heating coil 36 so as to heat the cylindrical die 33 to a desired temperature (500° to 600° C.). Then, the vacuum vessel 40 is exhausted through the exhaust outlet 41, and nitrogen gas is introduced from the gas inlet 42. After the introduction of nitrogen gas, the upper die 31 is driven toward the lower die 32, and the glass blank 2 is held under a predetermined pressure for a predetermined press time. Accordingly, the lens shape formed on the molding surfaces 31a and 32a of the upper die 31 and lower die 32 is transferred to the glass blank 2. Here, since the carbon film 3 is formed on the surface of the glass blank 2 while the TiAlN film 1 is formed on each of the molding surfaces 31a and 32a of the upper die 31 and lower die 32, the glass blank 2 and the molding surfaces 31a and 32a of the upper die 31 and lower die 32 are prevented from fusing together.

Thereafter, supply of the electric power to the induction heating coil 36 is stopped, and the cylindrical die 33 is gradually cooled. Then, the upper die 31 is driven upward so as to open the mold, and a lens, which is a molded article, is removed therefrom. Here, since the carbon film 3 is formed on the surface of the glass blank 2 while the TiAlN film 1 is formed on the molding surfaces 31a and 32a of the upper die 31 and lower die 32, the molded lens and the upper die 31 and lower die 32 are prevented from fusing together, whereby the lens can be easily released from the upper die 31 and lower die 32.

Here, since the carbon film 3 is attached to the surface thereof, the lens is subjected to plasma processing or annealing so as to remove the carbon film 3 as carbon monoxide or carbon dioxide gas, thereby obtaining the lens as the final product.

The experiments conducted by the inventor, in which the molding surfaces 31a and 32a of the upper die 31 and lower die 32 are observed after repeated molding operations of such a lens, have confirmed that there are neither discoloration nor roughness in the surface.

Thus, in the TiAlN film 1 formed on the molding surfaces 31a and 32a of the upper die 31 and lower die 32 in accordance with the present invention, since aluminum oxide is formed thereon by Al contained in TiAlN, as compared with the TiN film or the like disclosed in the above-mentioned Japanese Patent Publication No. 7-45331, a higher hardness and a heat resistance temperature of 600° C., which is higher by about 200° C., are obtained. Further, once aluminum oxide is formed, oxidation does not proceed inside. Accordingly, even when these dies are used in glass molding performed at a high temperature of 500° to 600° C., their surfaces are prevented from being discolored, becoming rough, and being oxidized. Also, since the surface of the TiAlN film 1 is polished to a center-line mean roughness of about 1 nm, it is excellent in specular characteristic. Accordingly, the upper die 31 and lower die 32 can be greatly improved in terms of heat resistance, oxidation resistance, specular characteristic, and durability, while the molded article is prevented from being fogged and so forth due to roughness in the molding surfaces 31a and 32a, whereby favorable molded articles can always be formed. Further, the glass blank 2 and the upper die 31 and lower die 32 are prevented from fusing together, whereby the releasability of the upper die 31 and lower die 32 and the molded article with respect to each other can be improved.

Though the TiAlN film 1 is formed on the molding surfaces 31a and 32a of the upper die 31 and lower die 32 by a sputtering technique in the foregoing embodiment, it may be formed by various kinds of methods such as an ion plating technique.

Also, while the TiAlN film 1 is formed only on the molding surfaces 31a and 32a of the upper die 31 and lower die 32, it may also be formed on the side faces or rear faces of the upper die 31 and lower die 32, as well as on the whole surface of the cylindrical die 33. In this case, not only the molding surfaces 31a and 32a but the mold as a whole can be improved in terms of durability, while the sliding characteristics of the upper die 31 and lower die 32 and the cylindrical die 33 with respect to each other can be improved, whereby molded articles can be produced stably.

Though the ratio of Ti/Al in the TiAlN film is set to 1:1 in the above-mentioned embodiment, this ratio may be changed in various ways according to the desired heat resistant temperature, durability, and the like.

Also, while only the cylindrical die 33 of the press-molding machine 30 is heated in the above-mentioned embodiment, the inside of the vacuum vessel 40 as a whole may be heated.

Further, though only the upper die 31 is driven to mold the glass blank 2 in the above-mentioned embodiment, both of the upper die 31 and lower die 32 or only the lower die 32 may be driven to mold the glass blank 2.

Also, while a lens is molded from the glass blank in the above-mentioned embodiment, the present invention can similarly be applied to cases where various kinds of optical elements such as prism and filter are molded.

As explained in detail in the foregoing, in the method of forming a mold release film in accordance with the present invention, since a TiAlN film is formed on at least molding surfaces of a mold, due to aluminum oxide generated upon oxidation of Al contained in the TiAlN film, this film has a hardness higher than that of the conventional TiN film or the like and a heat resistance temperature of about 600° C., which is higher than that of the TiN film by about 200° C. Further, due to the presence of aluminum oxide, oxidation is prevented from further proceeding inside.

Accordingly, even when the mold is used in glass molding performed at a high temperature of 500° to 600° C., its surface is prevented from being discolored, becoming rough, and being oxidized, whereby the mold can be improved in terms of heat resistance, oxidation resistance, and durability.

Also, since the surface of the TiAlN film is polished to a center-line mean roughness of about 1 nm or less, its specular characteristic can be improved, whereby the surface of the molded article can be prevented from being fogged and so forth, allowing an optical element having a favorable surface without roughness to be molded.

Further, the glass blank and the upper die and lower die are prevented from fusing together, whereby the releasability of the upper die and lower die and the molded article with respect to each other can be improved.

Also, when the TiAlN film is formed not only on the molding surfaces of the upper and lower dies but also on the side faces or rear faces of the upper and lower dies, as well as on the whole surface of the cylindrical die, not only the molding surfaces but the mold as a whole can be improved in terms of durability, while the sliding characteristics of the upper die and lower die and the cylindrical die with respect to each other can be improved, whereby molded articles can be produced stably.

What is claimed is:

1. A method of forming a mold release film on a mold comprising an upper die, a lower die, and a cylindrical die used for press molding of an optical element, said method comprising the steps of:

forming a TiAlN film on at least molding surfaces of said upper and lower dies; and polishing said TiAlN film so as to yield a center-line mean roughness of about 1 nm or less.

2. A method according to claim 1, wherein said TiAlN film is also formed on side faces of said upper and lower dies and whole surface of said cylindrical die.

* * * * *